(12) United States Patent
Karpov et al.

(10) Patent No.: US 7,411,268 B2
(45) Date of Patent: Aug. 12, 2008

(54) FABRICATING DEEPER AND SHALLOWER TRENCHES IN SEMICONDUCTOR STRUCTURES

(75) Inventors: Ilya Karpov, Santa Clara, CA (US); Tony Ozzello, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/822,361

(22) Filed: Apr. 12, 2004

(65) Prior Publication Data

US 2004/0188796 A1    Sep. 30, 2004

Related U.S. Application Data

(62) Division of application No. 10/209,204, filed on Jul. 31, 2002, now Pat. No. 6,794,268.

(51) Int. Cl.
  *H01L 29/00* (2006.01)
(52) U.S. Cl. .................................. 257/510; 257/506
(58) Field of Classification Search ............. 257/506, 257/510
See application file for complete search history.

(56) References Cited

U.S. PATENT DOCUMENTS 5,904,540 A * 5/1999 Sheng et al. ............... 438/427

* cited by examiner

*Primary Examiner*—Long Pham
(74) *Attorney, Agent, or Firm*—Trop, Pruner & Hu, P.C.

(57) ABSTRACT

Crossing trenches of different depths may be formed in the same semiconductor structure by etching the deeper trench first. The deeper trench and the substrate may then be covered with a material that prevents further etching. The covering is etched through for the shallower trench, leaving a protective covering in the deeper trench.

4 Claims, 2 Drawing Sheets

FABRICATING DEEPER AND SHALLOWER TRENCHES IN SEMICONDUCTOR STRUCTURES

This is a divisional of prior application Ser. No. 10/209,204, filed Jul. 31, 2002 now U.S. Pat. No. 6,794,268.

BACKGROUND

This invention relates generally to forming trenches such as trenches for isolation purposes, in the fabrication of microelectronic integrated circuits.

In some cases, it is desirable to form trench isolations with two different trench depths. Conventionally this may be done by forming a trench of a first depth, covering the formed trench, and forming a trench of a second depth. Trenches of different depth that run parallel to one another may be formed by etching the shallow trench and then the deep trench. More particularly, both the shallow and the deep trench may be formed to the shallow depth. Then one shallow trench may be protected, for example with resist, leaving one of the shallow trenches unprotected. The unprotected shallow trench is then extended with etching to form the deeper trench.

However, this approach does not work when the trenches cross one another. For example, if two shallow trenches are etched across one another and then one of the trenches is protected with a resist while the other trench is deepened, the deeper trench has a bump where it crosses the shallow trench because of the protection applied in the shallow trench.

Thus, there is a need for better ways to fabricate trenches at different depths that cross one another.

DETAILED DESCRIPTION

Figure 1:
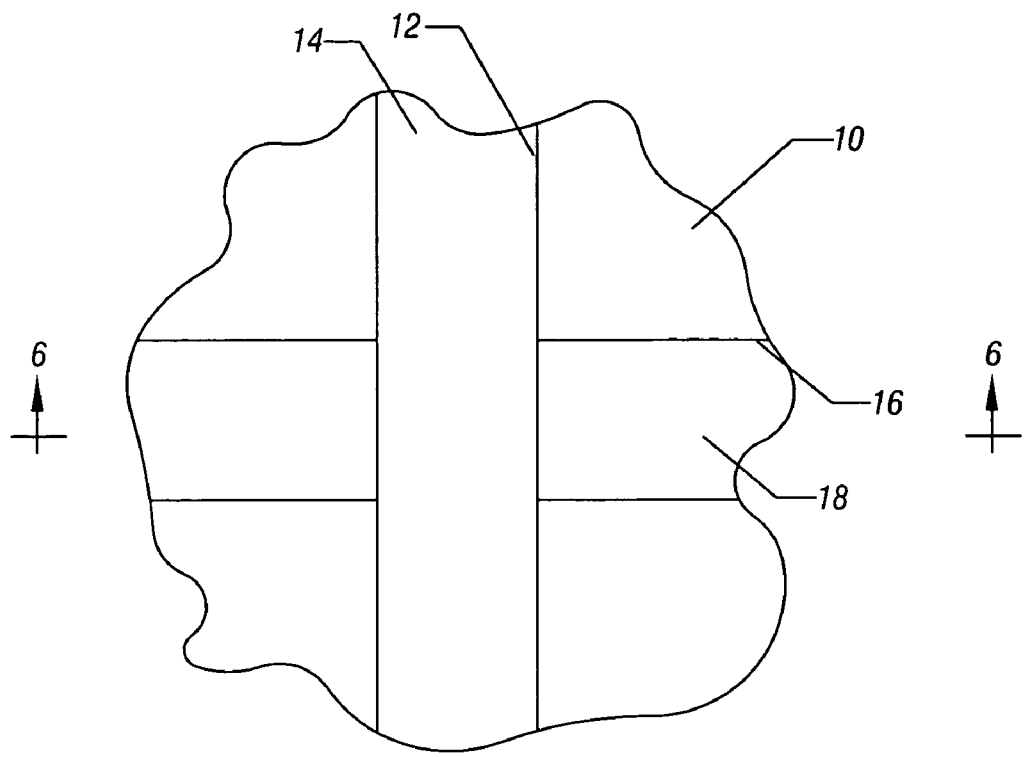
FIG. 1 is an enlarged top plan view of one embodiment of the present invention.

Referring to FIG. 1, a deeper trench 12 may cross a shallower trench 16. Each of the trenches may be formed in the same wafer 10. The trench 12 may be filled with a fill material 14 and the trench 16 may be filled with a fill material 18.

Figure 2:
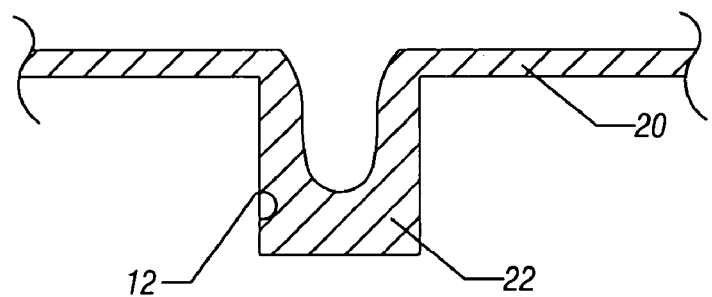
FIG. 2 is an enlarged cross-sectional view at an early stage of manufacture of the structure shown in FIG. 1 in accordance with one embodiment of the present invention.

Initially, the deeper trench 12 may be formed and may be filled with an appropriate protective layer including a portion 20 on the surface of the wafer 10 and a portion 22 that collects down in the trench 12 as shown in FIG. 2. Because of the topography of the trench 12, more of the fill material 22 may collect within the trench 12 than on the surface of the wafer 10. Thus, the thickness of protective material 22 may be greater than the thickness of the protective material 20. The protective material 20, 22 may be resist, spin-on glass, or spin-on polymer, to mention a few examples.

Figure 3:
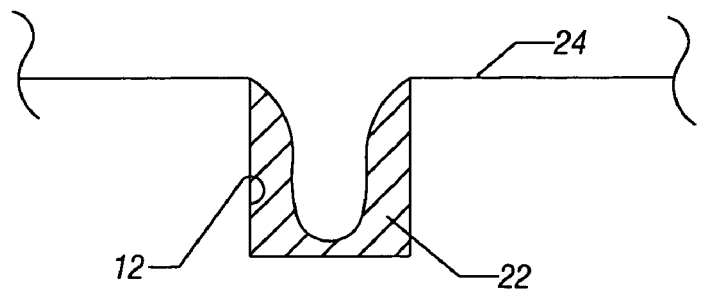
FIG. 3 is a cross-sectional view corresponding to FIG. 2 at a later stage of manufacture.

Thereafter, the material 20 may be removed from the surface of the wafer 10 using an appropriate etching process. However, because of the greater thickness of the material 22 within the trench 12, a substantial portion of that material remains as indicated in FIG. 3. This remaining material 22 is effective to protect the trench 12 during the etching of the shallower trench 16.

Figure 4:
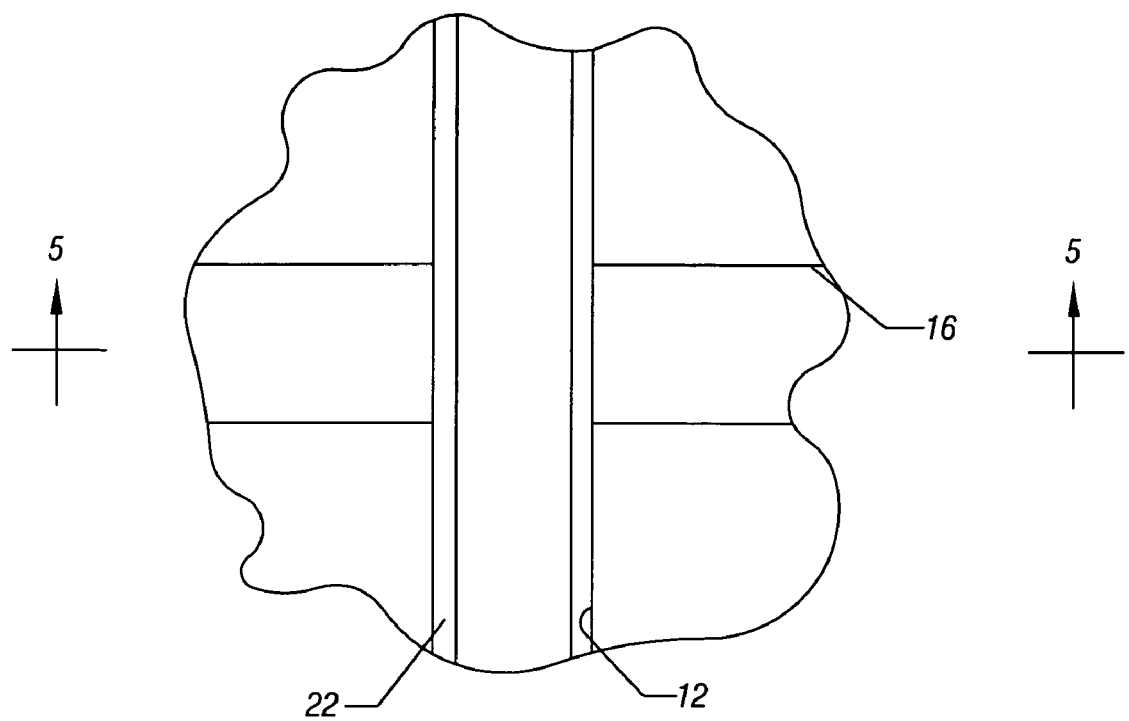
FIG. 4 is a top plan view at a subsequent stage of manufacture in accordance with one embodiment of the present invention.
Figure 5:
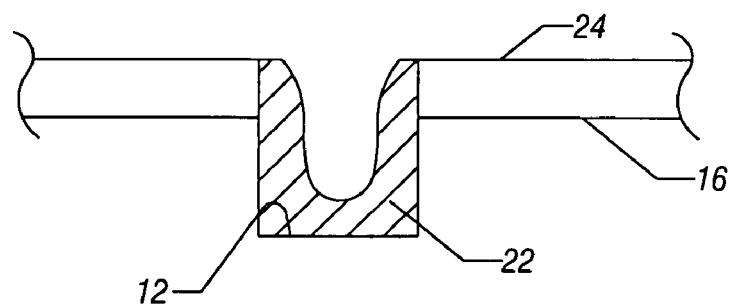
FIG. 5 is a cross-sectional view taken generally along the line 5-5 in FIG. 4.
Figure 6:
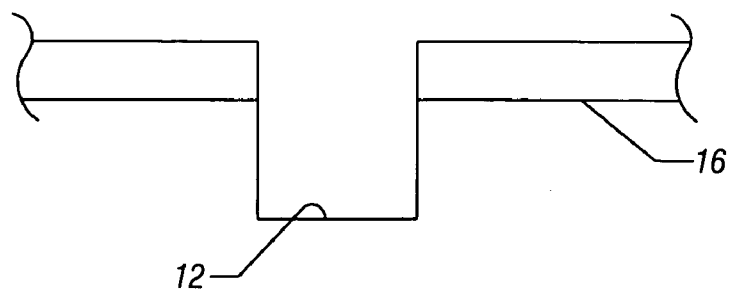
FIG. 6 is a cross-sectional view taken generally along the line 6-6 in FIG. 1.

Referring to FIG. 4, the shallower trench 16 may be etched with the material 22 still in the trench 12. As shown in FIG. 5, the shallower trench 16 may be etched with the upstanding material 22 remaining in the deep trench. Thereafter, the fill material 22 may be cleaned as shown in FIG. 6.

As a result, the deeper trench 12 may be formed first and the shallower trench 16 may be formed second without the problem of creating an irregularity where the trenches cross.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a semiconductor structure;
   a first and a second trench formed in said semiconductor structure, said first trench formed to a first depth, said second trench extending across and perpendicular to a length of said first trench and formed to a second depth less than said first depth; and
   a covering in said first trench and over said semiconductor structure, said covering having an opening therethrough, said opening in communication with said second trench, wherein a thinner portion of said covering that is over said semiconductor structure is thinner than a thicker portion of said covering along a center line of said first trench, said thinner portion of said covering other than in said first or second trench, said covering in said first trench being thicker away from said center line than along said center line.

2. The circuit of claim 1 wherein said opening does not extend through said covering in said first trench to expose said semiconductor structure.

3. The circuit of claim 1 wherein the covering partially fills said first trench.

4. The circuit of claim 3 wherein the covering in said first trench includes an upstanding portion at the intersection of said first and second trenches, the upstanding portion extending above a bottom surface of said second trench to an upper surface of said substrate.

* * * * *